(12) United States Patent
Liardet et al.

(10) Patent No.: US 7,689,636 B2
(45) Date of Patent: *Mar. 30, 2010

(54) GENERATION OF A NORMALIZED RANDOM BIT FLOW

(75) Inventors: Pierre-Yvan Liardet, Peynier (FR); Yannick Teglia, Marseille (FR); Ambroise Tomei, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 972 days.

This patent is subject to a terminal disclaimer.

(21) Appl. No.: 10/927,869

(22) Filed: Aug. 27, 2004

(65) Prior Publication Data
US 2005/0050124 A1 Mar. 3, 2005

(30) Foreign Application Priority Data
Aug. 28, 2003 (FR) .................................. 03 50467

(51) Int. Cl.
*G06F 7/58* (2006.01)
(52) U.S. Cl. .................................................... 708/250
(58) Field of Classification Search .......... 708/250–256
See application file for complete search history.

(56) References Cited
U.S. PATENT DOCUMENTS

| 3,706,941 | A | 12/1972 | Cohn |
| 4,213,101 | A | 7/1980 | Policand et al. |
| 4,408,298 | A | 10/1983 | Ruhland |
| 4,545,024 | A | 10/1985 | Maher et al. |
| 6,862,605 | B2 * | 3/2005 | Wilber ........................ 708/255 |
| 7,007,051 | B2 * | 2/2006 | Hourdequin et al. ......... 708/250 |
| 7,266,575 | B2 * | 9/2007 | Ikeda .......................... 708/250 |
| 2004/0158591 | A1 * | 8/2004 | Crispin ....................... 708/250 |
| 2005/0249273 | A1 * | 11/2005 | Ashley et al. ................ 375/232 |

OTHER PUBLICATIONS

French Search Report from corresponding International or Foreign National Application No. 03 50467, filed Aug. 28, 2003.
Patent Abstracts of Japan, vol. 2000, No. 13, Feb. 5, 2001 & JP 2000 298577 A, Taiji Makoto, *Random Number Number Generation Device*, Oct. 24, 2000.
John von Neumann, "Various Techniques Used in Connection with Random Digits", *Journal Res. Nat. Bus. Stand.*, vol. 3, pp. 768-770, 1963.

* cited by examiner

*Primary Examiner*—Chat C Do
(74) *Attorney, Agent, or Firm*—Lisa K. Jorgenson; James H. Morris; Wolf, Greenfield & Sacks, P.C.

(57) ABSTRACT

A method and a circuit for normalizing a noise source providing an initial bit flow, including conditioning the state of an output bit to the respective states of the bits of the initial flow examined by words of identical lengths and, upon occurrence of a word of bits of identical states, conditioning the state of the current output bit to the state of at least one previous output bit.

8 Claims, 1 Drawing Sheet

GENERATION OF A NORMALIZED RANDOM BIT FLOW

BACKGROUND OF THE INVENTION

1. Field of the Invention

The present invention relates to the field of random number generators and more specifically to generators of random numbers in the form of bit flows originating from one or several noise sources, digital or digitized.

2. Discussion of the Related Art

FIG. 1 very schematically shows in the form of blocks an example of a bit flow generator of the type to which the present invention applies.

Such a generator is based on the use of a noise source 1 (NS) providing an analog noise to an analog-to-digital conversion elements 2 (CAD) clocked by a clock CLK and providing a bit flow BS. Source 1 is, for example, formed of one or several oscillators having their outputs added up to provide an analog noise at the input of converter 2. Converter 2 may, in simplified fashion, be a comparator associated with a flip-flop.

The quality of a random generator or more generally of a noise source is measured by the quality of its random character, that is, the equiprobability for flow BS to provide any number and, in particular, the equiprobability of finding 0s and 1s in the flow.

In practice, there is a risk for flow BS provided by converter 2 not to have an equiprobable distribution of its elements (bits or bit words). In particular, noise source 1 generally uses oscillators for which there is a risk of synchronization, together or with clock CLK. In case of a synchronization, the output state (flow BS) remains constant.

To improve the equiprobability of a bit flow supposed to be random, flow BS crosses a normalization circuit 3 (NORM) providing a modified bit train NBS and in which the equiprobable character of the zeroes and ones in the flow is improved.

FIG. 2 shows a conventional example of a circuit 3 for normalizing a bit flow BS applying a so-called Von Neumann method. Such a circuit 3 is based on an analysis of incoming bit flow BS, by bit pairs. A storage element 4 (BUFF) enabling processing of the bits, by pairs, in a state determination circuit 5 which provides normalized bit flow NBS, is then used. According to the Von Neumann method, if the bit pair is 10, a state 1 is generated. If the bit pair is 01, a state 0 is generated. If the bit pair is 00 or 11, it is ignored, that is, no state is output.

A disadvantage of the Von Neumann method is that the rate of normalized bit flow NBS is not constant, that is, the period with which the bits are provided is not regular. In a simple Von Neumann circuit such as that described hereabove, the bit rate of flow NBS varies between twice and four times less than the rate of input flow BS.

SUMMARY OF THE INVENTION

The present invention aims at providing a normalization of a noise source providing a digital bit flow which improves known Von Neumann solutions.

The present invention more specifically aims at making the output rate of the normalization element constant.

The present invention also aims at increasing the flow rate with respect to a normalization of Von Neumann type.

To achieve these and other objects, the present invention provides a method for normalizing a noise source providing an initial bit flow, comprising:

conditioning the state of an output bit to the respective states of the bits of the initial flow examined by words of identical lengths; and upon occurrence of a word of bits of identical states, conditioning the state of the current output bit to the state of at least one previous output bit.

According to an embodiment of the present invention, the occurrence of a word of bits of identical states further conditions the state of an inversion bit of the general output flow.

The present invention also provides a circuit for normalizing a bit flow coming from a noise source, comprising:

an element for storing the initial flow to allow exploitation of the bits by words of identical length; and an element for determining the state of an output bit according to the combination of the states of each bit word of the initial flow, the state provided upon occurrence of a word having bits of identical states being conditioned by the state of at least one previous output bit.

According to an embodiment of the present invention, the circuit comprises an element for detecting words having bits of identical states conditioning an inversion of the states provided at the output of the assignment element.

BRIEF DESCRIPTION OF THE DRAWINGS

The foregoing objects, features, and advantages of the present invention will be discussed in detail in the following non-limiting description of specific embodiments in connection with the accompanying drawings.

DETAILED DESCRIPTION

Figure 1:
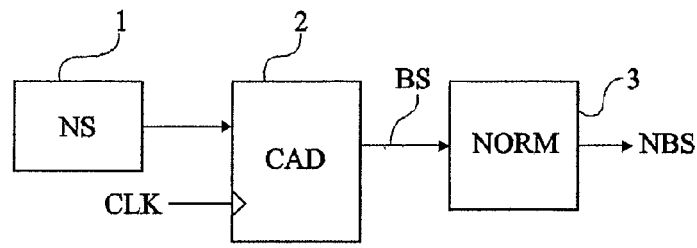
FIGS. 1 and 2, previously discussed, are intended to show the state of the art and the problem to solve.

The same elements have been designated with the same references in the different drawings. For clarity, only those elements which are necessary to the understanding of the present invention have been shown in the drawings and will be described hereafter. In particular, the obtaining of the bit flow to be normalized has not been detailed, the present invention being implementable whatever this flow and especially whether it has or not been submitted to other normalization processings. Similarly, the destination of the normalized bit flow obtained by the present invention is compatible with all conventional uses of bit flows for random generators and especially for a combination, for example, by parallel association of several bit flows, to obtain random words. For simplification, the present invention will be described in relation with an incoming flow processed by words of two consecutive bits. However, the invention can apply to words of greater length.

A feature of the present invention is, with respect to a normalization method of Von Neumann type, to assign an output state to the pairs of identical states and to condition, at least for these identical pairs, the state of the current output bit to the state of the output bit. According to the present invention, the assignment of a state to the pairs of identical states is thus not always performed in the same way as is the case for states 01 and 10 in a conventional Von Neumann method, but will depend on the state which has just been output. According to the chosen embodiment, the same state as the current state or its inverse is assigned.

Conversely to what used to be believed, it is possible to assign an output state to the pairs of identical bits while keeping an equiprobable flow, provided not to always assign the same output state to the occurrence of a doublet of a given type (00 or 11).

Figure 3:
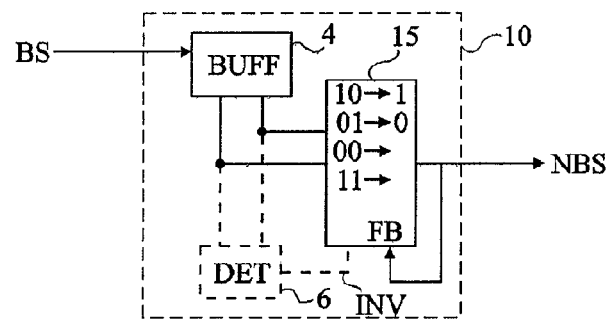
FIG. 3 very schematically shows in the form of blocks an embodiment of a normalization circuit according to the present invention.

FIG. 3 very schematically shows in the form of blocks an embodiment of normalization circuit according to the present invention.

Figure 2:
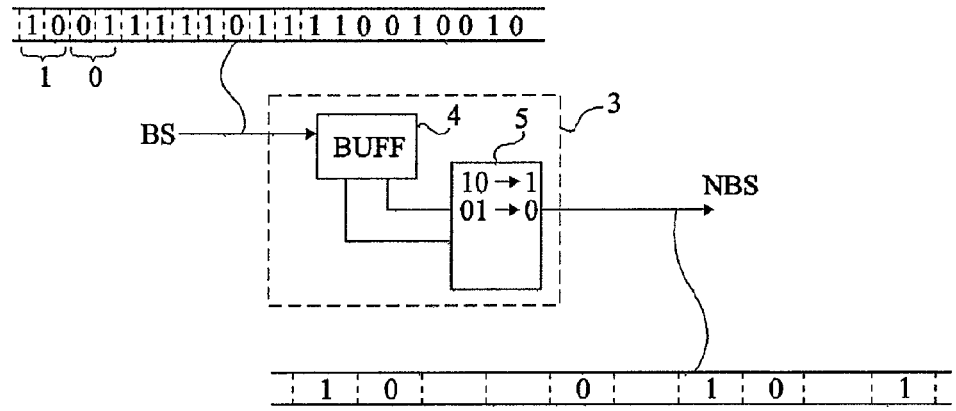

As in the conventional case of FIG. 2, at least one bit of incoming flow BS is stored (block 4, BUFF) to enable processing of the flow bits by pairs. According to the way in which the bit pairs are processed in practice, two successive bits of flow BS, or even more, may have to be stored.

According to the present invention, a state determination element 15 provides a normalized output bit flow NBS according to the respective states of the current bit pair of flow NS. Element 15 also receives feedback signal FB which corresponds to the state of output flow NBS.

According to a first implementation, the feedback signal is only taken into account to determine the states to be assigned in the presence of a doublet 00 or 11. In this case, the states assigned to pairs 01 and 10 are, like in a conventional Von Neumann system, 0 and 1 (or conversely). However, upon occurrence of a doublet 00 or 11, a state 1 is assigned if the output bit determined by the previous bit was 0 and a state 0 is assigned in the opposite case.

With such an implementation, for example, an incoming bit flow BS 01100001101111110100 translates as a normalized output flow NBS 0100101001.

According to a second embodiment, element 15 also receives a signal (bit) for configuring the inversion (INV) of a block 6 (DET) for detecting doublets in bit flow BS. Bit INV is used to cause the inversion of the state provided for pairs 01 and 10 upon occurrence of doublets 00 and 11. The states of pairs 01 and 10 will thus not always be the same, conversely to a conventional Von Neumann system. By arbitrary convention for bit INV, a state 1 is considered as being active and a state 0 is considered as being inactive.

For example, the state of bit INV is inverted each time a pair 00 or 11 occurs, and determination element 15 is provided to provide the following states:

for an incoming pair 01: 0 if bit INV is inactive, 1 in the opposite case;

for a pair 10: 1 if bit NV is inactive, 0 in the opposite case;

for a pair 00: the inverse of the state of the previous output bit if bit INV is active, the state of the previous bit in the opposite case; and for a pair 11: the inverse of the state of the previous bit if bit INV is active, the state of the previous bit in the opposite case.

With such an embodiment and assuming, for example, that bit INV initially is in the inactive state, an incoming bit flow BS 01100001101111110100 translates as a normalized output flow NBS 0111011000.

For simplification, it has been considered that the decision as to the state of the output, upon occurrence of a doublet, is taken before the possible change of the state of bit INV. The contrary is however possible.

Other decision configurations are of course possible, provided to condition the state of the output bit generated for a doublet to the state of the previous output bit.

An advantage of the present invention is that the rate of the normalized bit flow thus obtained is only divided by two with respect to the original flow.

Another advantage is that this flow is constant.

Of course, the present invention is likely to have various alterations, modifications, and improvements which will readily occur to those skilled in the art. In particular, the practical implementation of a normalization circuit according to the present invention, be it in hardware and software form, is within the abilities of those skilled in the art based on the functional indications given hereabove by using conventional tools.

Further, although the present invention has been described in relation with the exploitation of bit pairs, it more generally applies whatever the length (even or odd) of considered words or sections of the incoming flow. For example, the incoming bits may be processed four by four where the conventional Von Neumann method does not consider words with four bits of identical states (0000 and 1111). Adapting the described embodiments to words of more than two bits is within the abilities of those skilled in the art.

Further, instead of using the previous bit state, the state of the current output bit may be conditioned to the state of a still previous bit or to a function of several previous output bits, whatever their positions with respect to the current bit, provided that they all are previous bits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for normalizing a noise source providing an initial bit flow to a normalization circuit, the method comprising:

determining a state of an output bit output from a determination circuit, the state of the output bit based at least in part on respective states of the bits of the initial bit flow detected by a determination circuit that analyzes multi-bit words of identical lengths;

upon detection of a word with bits of identical states, further determining the state of the output bit based in part on the state of at least one previous output bit provided by a feedback signal; and outputting, from the normalization circuit, the output bit to produce an output bit flow having a constant rate, wherein bits in the output bit flow are equally spaced in time.

2. The method of claim 1, in which the detection of a word with bits of identical states changes the state of an inversion bit, further determining the state of the output bit based in part on the state of the inversion bit.

3. A circuit for normalizing a bit flow coming from a noise source, the circuit comprising:

a storage circuit for storing an initial bit flow to allow processing of the initial bit flow by analysis words of identical length; and a determination circuit for detecting a state of each bit in each analysis word of the initial bit flow, and for outputting, for every analysis word, an output bit based at least in part on a combination of the states of the bits in the analysis word to produce an output bit flow having bits that are equally spaced in time, wherein upon occurrence of an analysis word having bits of identical states, the state of the output bit is further determined in part based on the state of at least one previous output bit provided by a feedback signal.

4. The circuit of claim 3, comprising a detection circuit for detecting analysis words having bits of identical states and an inversion bit, the state of the inversion bit modifying the state of the output bit.

5. A system for generating a normalized bit flow, the system comprising:
- an initial bit flow generated by at least one noise source and at least one analog-to-digital conversion circuit;
- a storage circuit for storing at least a portion of the initial bit flow to allow processing of the bits by analysis words of identical length; and
- a determination circuit connected to said storage circuit for detecting a state of each bit in each analysis word, and for outputting the normalized bit flow, the normalized bit flow comprising output bits that are equally spaced in time, the state of each output bit based in part on a combination of the states of the bits in the respective analysis word, the state of each output bit is being further determined in part based on the state of at least one previous output bit provided as a feedback signal from the normalized bit flow when the analysis word consists of bits of identical states.

6. The system of claim 5, further comprising a detection circuit connected to said determination circuit and said storage circuit, and an inversion bit, the state of the inversion bit modifying the state of each output bit in the normalized bit flow.

7. The system of claim 6, wherein the state of the inversion bit is changed when the detection circuit detects analysis words having bits of identical states.

8. The system of claim 6, wherein the state of the inversion bit is sensed by the determination circuit to modify the state of each output bit in the normalized bit flow.

* * * * *